(12) United States Patent
Lueders et al.

(10) Patent No.: US 11,004,942 B2
(45) Date of Patent: May 11, 2021

(54) CONTROLLING BI-DIRECTIONAL SWITCHING DEVICES

(71) Applicant: TEXAS INSTRUMENTS INCORPORATED, Dallas, TX (US)

(72) Inventors: Michael Lueders, Freising (DE); Johan Strydom, Saratoga, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 648 days.

(21) Appl. No.: 15/859,429

(22) Filed: Dec. 30, 2017

(65) Prior Publication Data

US 2019/0207590 A1 Jul. 4, 2019

(51) Int. Cl.
*H01L 29/20* (2006.01)
*H01L 27/06* (2006.01)

(52) U.S. Cl.
CPC ...... *H01L 29/2003* (2013.01); *H01L 27/0605* (2013.01)

(58) Field of Classification Search
CPC .............. H01L 27/0605; H01L 29/2003
USPC ................. 327/365, 419, 425, 426
See application file for complete search history.

(56) References Cited

U.S. PATENT DOCUMENTS

| | | | | |
|---|---|---|---|---|
| 2006/0279351 A1* | 12/2006 | Salato | ..................... | H03K 17/20 327/524 |
| 2009/0065810 A1* | 3/2009 | Honea | ............... | H01L 29/42316 257/192 |
| 2011/0204807 A1* | 8/2011 | Hashizume | ........... | H01L 29/808 315/246 |
| 2011/0305054 A1* | 12/2011 | Yamagiwa | ......... | H03K 17/6871 363/125 |
| 2012/0275076 A1* | 11/2012 | Shono | ................... | H01M 10/48 361/86 |
| 2013/0271187 A1* | 10/2013 | Hayashi | ................. | H03K 17/16 327/109 |

* cited by examiner

*Primary Examiner* — William Hernandez
(74) *Attorney, Agent, or Firm* — Ray A. King; Charles A. Brill; Frank D. Cimino

(57) ABSTRACT

In some examples, a system comprises a bi-directional gallium nitride (GaN) device including first and second switches and a substrate, the first switch including a first gate and a first source, the second switch including a second gate and a second source, and the substrate shared between the first and second switches. The system include a third switch coupled to the first source and the substrate. The system includes a fourth switch coupled to the second source and the substrate and a comparator having inputs coupled to the first and second sources and outputs coupled to the third and fourth switches.

19 Claims, 5 Drawing Sheets

CONTROLLING BI-DIRECTIONAL SWITCHING DEVICES

BACKGROUND

A bi-directional switching device, such as a bi-directional gallium nitride (GaN) switching device, controls the flow of current in multiple directions and occupies less physical space than traditional bi-directional silicon switches. The switching device typically includes multiple gate terminals that are driven separately using gate drivers having isolated power domains.

SUMMARY

In some examples, a system comprises a bi-directional gallium nitride (GaN) device including first and second switches and a substrate, the first switch including a first gate and a first source, the second switch including a second gate and a second source, and the substrate shared between the first and second switches. The system include a third switch coupled to the first source and the substrate. The system includes a fourth switch coupled to the second source and the substrate and a comparator having inputs coupled to the first and second sources and outputs coupled to the third and fourth switches.

In some examples, a system comprises a bi-directional gallium nitride (GaN) device having first and second sources, first and second gates, and a substrate; a first switch positioned between the first gate and a power rail; a second switch positioned between the second gate and the power rail; a third switch having a third source coupled to the first source; a fourth switch having a fourth source coupled to the second source, the third and fourth switches having coupled drains; a fifth switch positioned between the first gate and the first source; a sixth switch positioned between the second gate and the second source; and a comparator having a first input coupled to the drains and a second input to receive a threshold signal, an output of the comparator usable to control activation of the bi-directional gallium nitride (GaN) device.

In some examples, a system comprises a bi-directional gallium nitride (GaN) device comprising first and second gates, first and second sources, and a substrate. The system includes a first buffer element coupled to the first gate and to a first level shifter, a second buffer element coupled to the second gate and to a second level shifter, a first capacitor coupled to the first source and to the first buffer element, and a second capacitor coupled to the second source and to the second buffer element. The system includes a first diode coupled to the first capacitor, and a second diode coupled to the second capacitor.

BRIEF DESCRIPTION OF THE DRAWINGS

For a detailed description of various examples, reference will now be made to the accompanying drawings in which.

DETAILED DESCRIPTION

A bi-directional switching device (also referred to herein as a "bi-directional device") typically includes two switches and five terminals: two gate terminals, two source terminals, and a shared substrate terminal that is common to the two switches. The two switches share a common drain drift region, thereby providing significant reductions in physical space requirements for the switching device when compared to traditional silicon bi-directional switches (i.e., in a back-to-back configuration). A significant drawback to bi-directional devices, however, is their requirement for separate drivers to drive their gate terminals. Specifically, such devices require separate gate driving signals generated by separate gate drivers that have their own isolated power domains. Such gate driver requirements offset the space and cost benefits realized by the shared drain region mentioned above and often make the bi-directional device an unattractive option when designing circuits. In addition, when a field effect transistor (FET) body or substrate terminal is not tied to the FET source terminal, the threshold voltage may become unstable. This is known as the "substrate-biasing effect" and is problematic in switching devices such as bi-directional GaN devices.

Disclosed herein are various examples of systems and methods for controlling a bi-directional switching device that resolve the foregoing problems by implementing a single isolated power domain with a power rail that is dynamically referred to the lower of the two potentials present at the source terminals and a shared substrate that is also referred to that same lower potential. In addition, the various examples may include a single gate driver and level shifting scheme that use the single isolated power domain to control the operation of the switches in the bi-directional device. By using a single isolated power domain and a single gate driver, the space and cost disadvantages associated with traditional bi-directional switches are mitigated. In addition, by coupling the substrate to the source terminal with the lower potential, the substrate-biasing effect is mitigated. The various examples are now described with respect to the drawings, with the following description treating a bi-directional gallium nitride (GaN) switching device as illustrative. The scope of this disclosure, however, is not limited to GaN devices. The systems and methods described herein can find application in any suitable type of bi-directional switching device.

Figure 1:
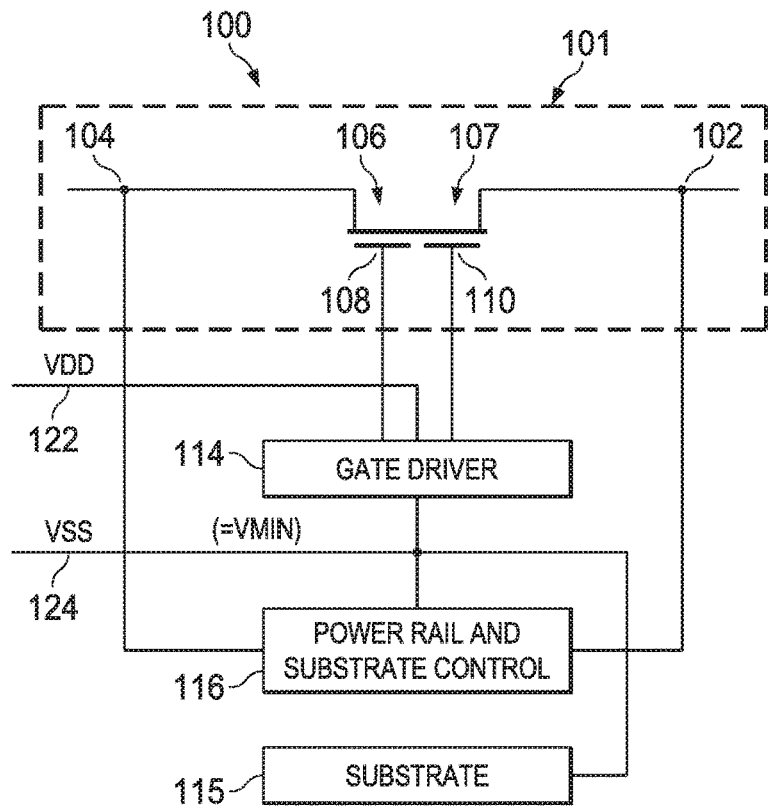
FIG. 1 is a schematic diagram depicting parts of an illustrative bi-directional switching device in accordance with various examples.

FIG. 1 is a schematic diagram depicting a system 100 in accordance with various examples. In some examples, the system 100 includes a bi-directional GaN device 101 including a switch 106 and a switch 107. Both switches may be implemented as field effect transistors (FETs) and may share a common drain drift region. The switch 106 includes a source terminal 104 and a gate terminal 108. The switch 107 includes a source terminal 102 and a gate terminal 110. The system 100 further includes circuitry to drive the bi-directional GaN device 101—in particular, a gate driver 114 to drive the gate terminals 108 and 110 and a power rail and substrate control device 116 to control the potential of the substrate 115 shared between the switches 106 and 107 as well as to control voltage potentials at a power rail, as described below. The power rail and substrate control device 116 couples to the shared substrate 115 of the switches 106 and 107 and further couples to the source terminals 102 and 104, as described in greater detail below. (In some examples, the substrate 115 is a global substrate, and in other examples, the substrate 115 is a localized well region within the global substrate.) The bi-directional GaN device 101 also includes power rails 122 (e.g., to supply a higher voltage potential) and 124 (e.g., to supply a lower voltage potential relative to the power rail 122). The power rails 122 and 124 may form a floating, isolated power supply (e.g., isolated using a galvanic isolation device, such as a transformer). In some examples, and as depicted in FIG. 1, the bi-directional GaN device 101 includes only a single gate driver 114 that is supplied by a single isolated power domain (as depicted by the power rails 122 and 124). Thus, the control circuitry for the bi-directional GaN device 101 realizes substantial physical space and cost savings relative to other control circuitry not implementing the techniques describe herein.

Figure 2:
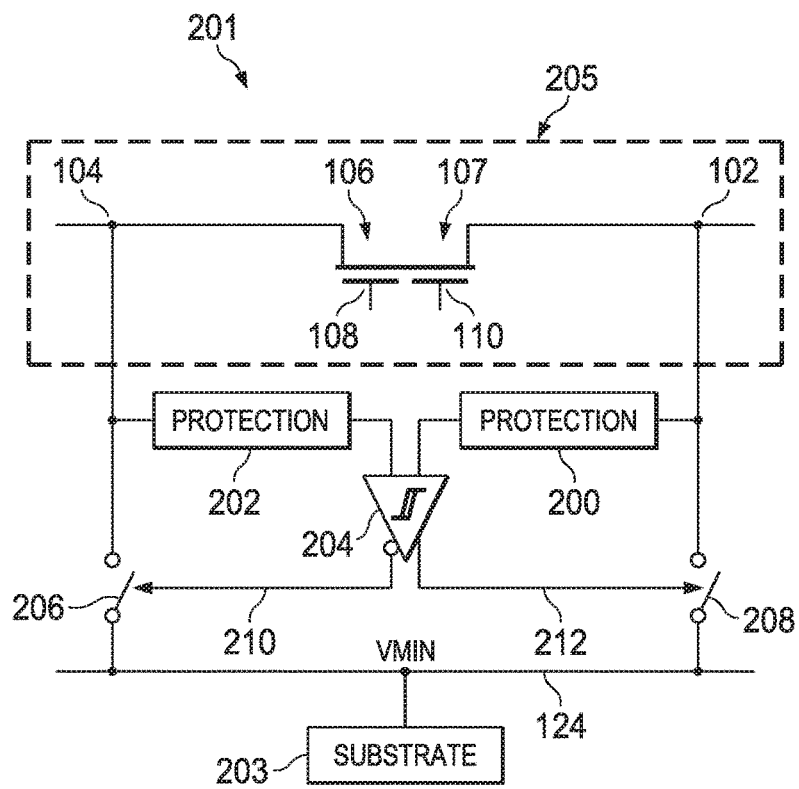
FIG. 2 is a schematic diagram depicting aspects of a power domain in an illustrative bi-directional switching device in accordance with various examples.
Figure 3:
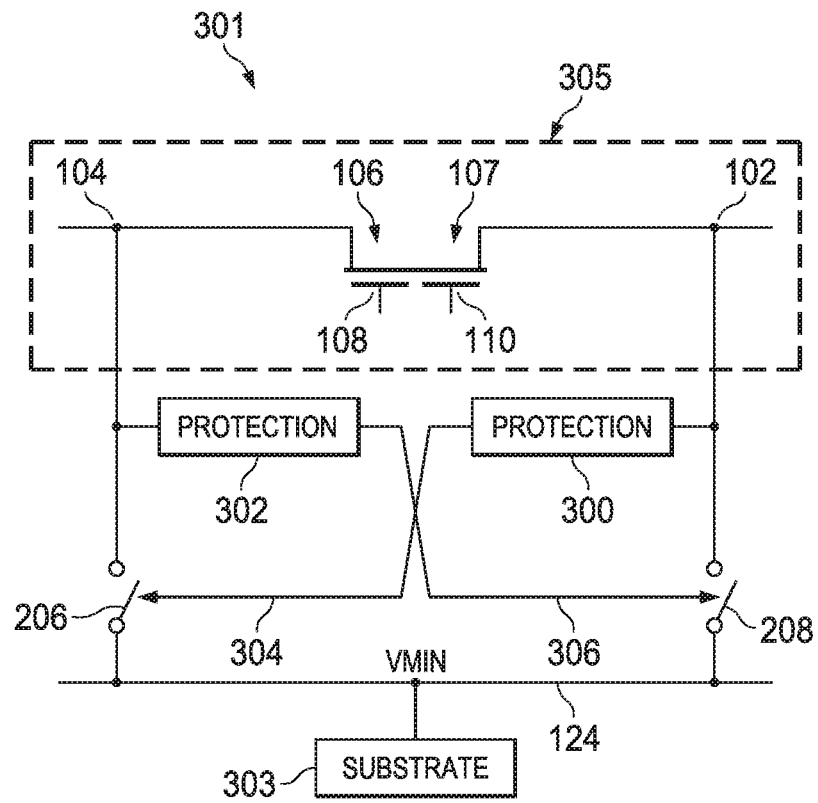
FIG. 3 is a schematic diagram depicting aspects of a power domain in an illustrative bi-directional switching device in accordance with various examples.

FIGS. 2-3 and the attendant text below depict and describe illustrative details and examples regarding the power rail and substrate control device 116 and the single isolated power domain of FIG. 1. FIGS. 4-8 and the attendant text below depict and describe illustrative details and examples regarding the single gate driver 114 of FIG. 1. Although the various examples of the bi-directional GaN device depicted in FIGS. 1-8 are numbered differently, in some examples, the devices are identical, with multiple figures merely depicting different features of the same device. In some examples, the devices are different, with multiple figures depicting features of different devices. Features of the various examples shown in FIGS. 1-8 may be combined as desired and as may be appropriate. The scope of this disclosure is not limited to any particular combination of the features depicted in FIGS. 1-8 and described herein.

FIG. 2 is a schematic diagram depicting aspects of a power domain that controls the substrate potential of an illustrative system 201 in accordance with various examples. In some examples, the system 201 includes a bi-directional GaN device 205 that includes the switches 106 and 107, with the switch 106 having the source terminal 104 and gate terminal 108 and the switch 107 having the source terminal 102 and the gate terminal 110. The system 201 further includes a substrate control device comprising a comparator 204. The comparator 204 receives as inputs the voltages present at the source terminals 102 and 104. In some examples, protection devices 200 and 202 (e.g., a high-voltage FET) may be implemented to protect the comparator 204 from overvoltage conditions. The comparator 204 provides two outputs 210 and 212, with one of the outputs (e.g., the output 210) being an inverted form of the other output (e.g., the output 212). The output 210 controls a switch (e.g., device high-voltage FET) 206, and the output 212 controls a switch (e.g., a high-voltage FET) 208. Because the output 210 is an inverted form of the output 212, the switches 206 and 208 will, in some examples, be in opposing states (e.g., when the switch 206 is closed, switch 208 is open, and vice versa). The switches 206 and 208 are able to switchably couple the source terminals 104 and 102 to the power rail 124, respectively.

In operation, the comparator 204 produces output signals 210 and 212 based on the relative potentials present at the source terminals 104 and 102. For example, in response to the source terminal 104 having a lower potential than the source terminal 102, the comparator 204 may produce an output signal 210 that is a logic HIGH and an output signal 212 that is a logic LOW. Similarly, in response to the source terminal 102 having a lower potential than the source terminal 104, the comparator 204 may produce an output signal 210 that is a logic LOW and an output signal 212 that is a logic HIGH. When the output signal 210 or 212 is a logic HIGH, the corresponding switch closes, and when the output signal 210 or 212 is a logic LOW, the corresponding switch opens. In this manner, the comparator 204 causes the power rail 124 to dynamically couple to the source terminal 102, 104 that has a lower potential relative to the other source terminal. This potential on the power rail 124 is applied to the shared substrate 203 and is used as part of the power domain to supply the single gate driver, as described in greater detail below. The lower potential among the two source terminals 102, 104 may be referred to herein as "Vmin."

FIG. 3 is a schematic diagram depicting aspects of a power domain in an illustrative system 301 in accordance with various examples. A bi-directional GaN device 305 comprises the switches 106 and 107, source terminals 102 and 104, and gate terminals 108 and 110. Further, the system 301 comprises the switches 206 and 208 and the power rail 124. The system 301 further includes an alternative version of the power rail and substrate control device of FIG. 2. In particular, the power rail and substrate control device in system 301 includes connections between the source terminal 104 and the switch 208 and between the source terminal 102 and the switch 206. In some examples, protection devices 300 and 302 may be positioned as shown.

In operation, the lower of the two potentials at the source terminals 102 and 104 will cause the corresponding switch 206, 208 to open, while the higher potential at the other source terminal will cause the corresponding switch 206, 208 to close. For example, if the source terminal 102 has a lower potential than the source terminal 104, this lower potential will cause the switch 206 to open, and the higher potential at the source terminal 104 causes the switch 208 to close, thus connecting the lower potential at source terminal 102 to power rail 124. In this manner, the source terminal 102 or 104 with the lower potential will connect to the power rail 124, and the source terminal 102 or 104 with the higher potential will not connect to the power rail 124. Thus, the power rail 124 is tied to Vmin, i.e., the lower of the potentials at the source terminals 102 and 104. The rail 124 provides Vmin to the substrate 303 and is used as part of the power domain to supply the single gate driver, as described in greater detail below. As with the architecture depicted in FIG. 2, because the substrate couples to the source terminal that is at Vmin, the substrate-biasing effect is mitigated.

Figure 4:
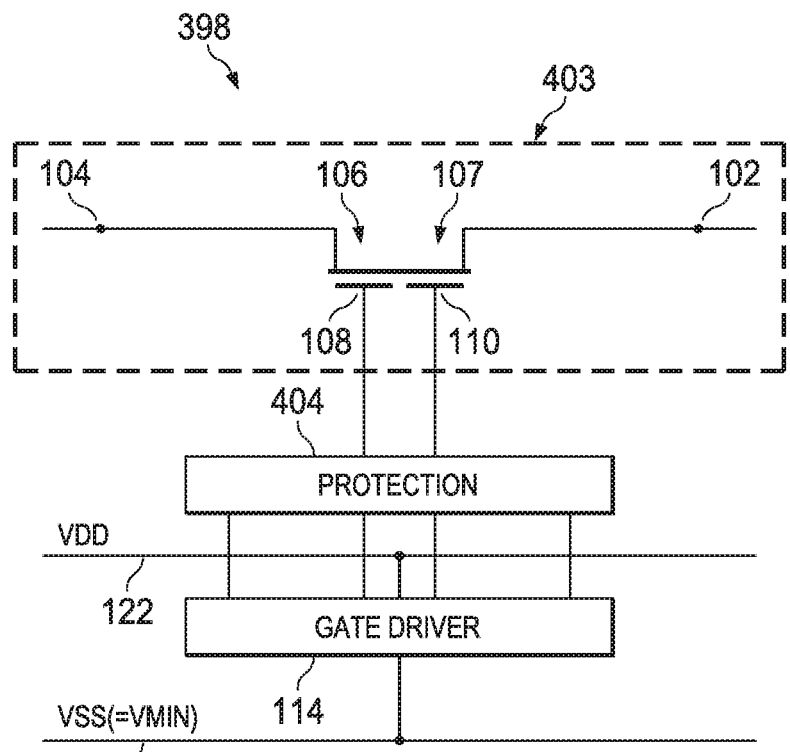
FIG. 4 is a schematic diagram depicting parts of an illustrative bi-directional switching device in accordance with various examples.

FIG. 4 is a schematic diagram depicting parts of an illustrative system 398 in accordance with various examples. A bi-directional GaN device 403 includes the switches 106 and 107, the source terminals 102 and 104, and the gate terminals 108 and 110. The system 398 further comprises a gate driver 114 and protection device 404. The gate driver 114 is powered by the power rails 122 and 124 and provides control signals to control the gate terminals 108, 110 to control the device 403. Although not expressly depicted in FIG. 4, the power rail 124 may be dynamically coupled to the lower potential of the potentials on the source terminals 102, 104 using any suitable architecture, such as the examples depicted in FIGS. 2 and 3. In some examples, the power rails 122, 124 are supplied by a galvanic isolation device.

In operation, the single gate driver 114 uses the single isolated power domain exemplified by power rails 122, 124 to drive the gate terminals 108, 110. The gate driver 114 is able to turn on and off the switches 106, 107. To control the gates 108, 110 of the switches 106, 107, a charging path is used to turn on the bi-directional GaN device 403 and a discharging path is used to turn off the bi-directional GaN device 403. Both the charging and the discharging paths are introduced in further detail below, along with the sequencing used to operate the charging and discharging paths.

Example implementations of the gate driver 114 are now depicted and described with respect to FIGS. 5-8.

Figure 5:
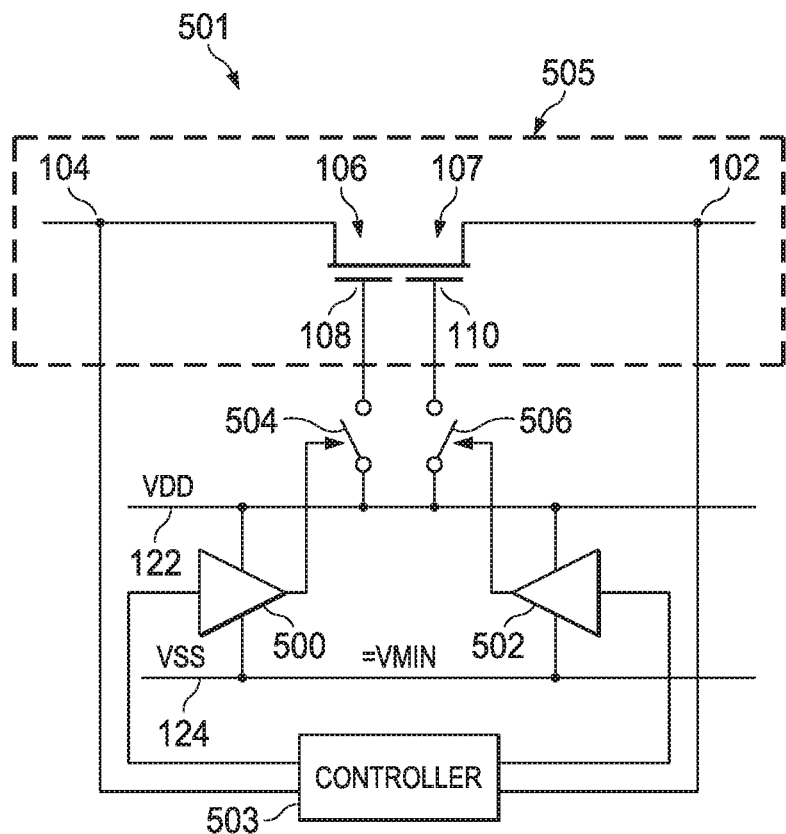
FIG. 5 is a schematic diagram depicting aspects of a gate driver in an illustrative bi-directional switching device in accordance with various examples.

FIG. 5 is a schematic diagram depicting aspects of an illustrative charging path in an example bi-directional GaN device 505 in a system 501. The bi-directional GaN device 505 may include switches 106, 107, source terminals 102, 104, and gate terminals 108, 110. The system 501 may further include power rails 122, 124. The system 501 may include a gate driver that comprises buffers 500, 502 and switches (e.g., high-voltage FETs) 504, 506. The buffers 500, 502 are powered by the power rails 122, 124. As previously explained, in some examples, the power rail 124 is switchably tied to the lower of the two potentials at the source terminals 102, 104. FIG. 5 also depicts a controller 503, which may or may not be considered part of the system 501. The switches 504, 506 can be considered as part of both the protection device 404 and the gate driver 114, as these switches are involved in both protection and driving functionalities.

In operation, the buffers 500, 502 receive control signals from any suitable source, such as the controller 503, which determines the manner in which the bi-directional GaN device 505 should operate. In response to these control signals, the buffers 500, 502 cause the switches 504, 506 to open and close. When a switch 504, 506 is closed, it couples the power rail 122 to the corresponding gate terminal 108, 110, thereby permitting the corresponding switch 106, 107 to turn on. Similarly, when a switch 504, 506 is opened, it disconnects the power rail 122 from the corresponding gate terminal 108, 110, thereby causing the corresponding switch 106, 107 to become floating (and eventually are turned off by the discharging path, as described in greater detail below). In this manner, the single gate driver that is composed of the buffers 500, 502 and the switches 504, 506 and that is powered by the single isolated power domain exemplified by power rails 122, 124 is able to control the operation of the switches 106, 107 for the purpose of charging the device 505. Thus, space and cost requirements are mitigated relative to other bi-directional GaN devices that do not implement the techniques described herein.

Figure 6:
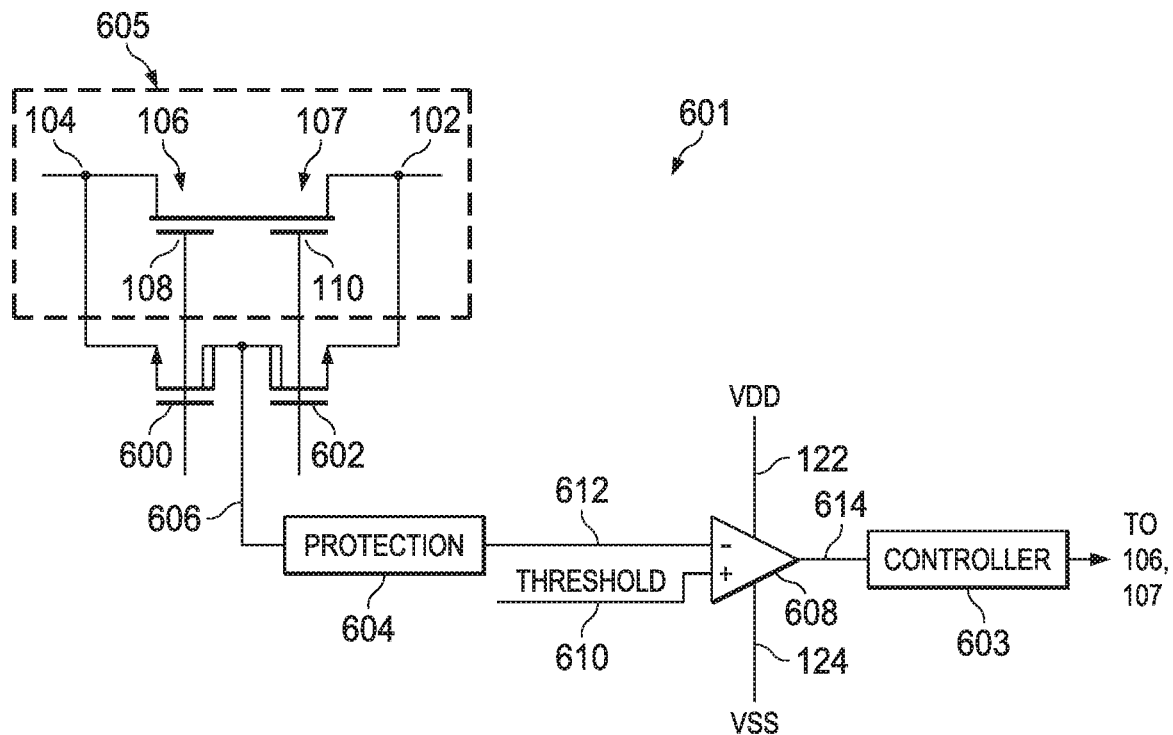
FIG. 6 is a schematic diagram depicting aspects of a gate driver in an illustrative bi-directional switching device in accordance with various examples.

FIG. 6 is a schematic diagram depicting aspects of a charging path for an illustrative gate driver in an example bi-directional GaN device 605 of a system 601. The bi-directional GaN device 605 comprises the switches 106, 107, the source terminals 102, 104, and the gate terminals 108, 110. The system 601 also includes a replica of the bi-directional GaN device 605—that is, the switches 600, 602 are a scaled version of the switches 106, 107, respectively, with their drains coupled to each other, but without their drain drift regions shared. The drains of the replica switches 600, 602 are coupled to a connection 606, and to a protection device 604 to protect downstream components from overvoltage conditions. A comparator 608 compares an output 612 of the protection device 604 to a threshold signal 610 to produce an output signal 614. The comparator 608 is powered by the power rails 122, 124 of the single power domain of the system 601. FIG. 6 also depicts a controller 603, which may or may not be considered part of the system 601.

When the controller 603, which is responsible for controlling the operation of the bi-directional GaN device 605, determines that the bi-directional GaN device 605 should be activated, the controller 603 first determines which of the source terminals 102, 104 has the lower potential (i.e., Vmin). For instance, the controller 603 may include a comparator that receives connections to the source terminals 102, 104 as inputs (such as the examples depicted in FIGS. 2 and 3). In response to this determination, the controller 603 turns on a corresponding switch 106, 107. For example, in response to the controller 603 determining that the source terminal 104 has a lower potential than the source terminal 102, the controller 603 may turn on the switch 106. Similarly, in response to the controller 603 determining that the source terminal 102 has a lower potential than the source terminal 104, the controller 603 may turn on the switch 107. After the first of the two switches 106, 107 has been turned on, the other switch should also be turned on before current can flow through the bi-directional GaN device system 601 between the two source terminals 102, 104. However, prior to turning on the remaining switch 106, 107, the controller 603 may wait until the output signal 614 indicates that the drain potential of the replica switches 600, 602 at connection 606 drops below the threshold signal 610, where the threshold signal 610 is determined by a circuit designer as desired and as may be appropriate. Once the output signal 614 indicates that the drain potential of the replica switches 600, 602 at connection 606 has dropped below the threshold signal 610, the controller 603 may cause the remaining switch 106, 107 to also turn on. The controller 603 and the system 601 may use such a multi-step approach to turning on both switches 106, 107 for safety reasons, i.e., to prevent a breakdown of the gates 108, 110 due to excessive gate-source voltage.

Figure 7:
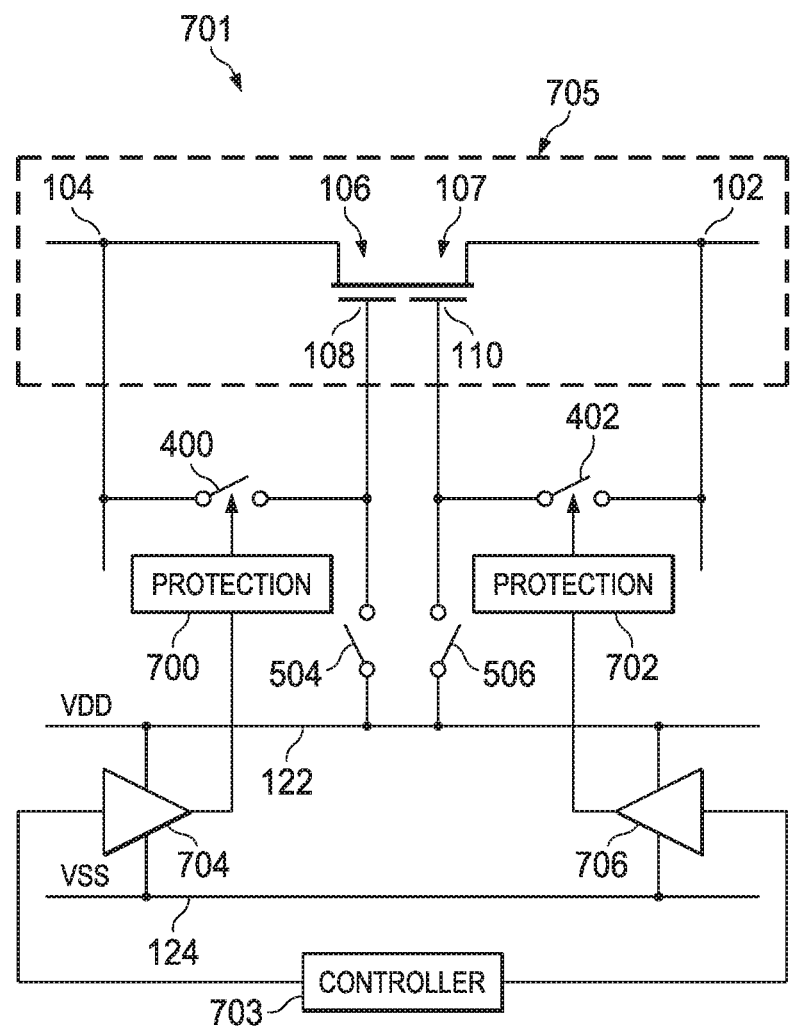
FIG. 7 is a schematic diagram depicting aspects of a gate driver in an illustrative bi-directional switching device in accordance with various examples.

FIG. 7 is a schematic diagram depicting aspects of an example discharge path for an illustrative bi-directional GaN device 705 in a system 701 in accordance with various examples. In some examples, the bi-directional GaN device 705 includes the switches 106, 107, the source terminals 102, 104, and the gate terminals 108, 110. In addition, in some examples, the system 701 may include power rails 122, 124 and gate driver circuitry. The switches 504 and 506 turn on the bi-directional device 705 as described above, and the switches 400 and 402 turn off the bi-directional device 705. The switch 400 (e.g. a low-voltage FET) is connected between the gate 108 and the source 104 of the switch 106. The switch 402 (e.g. a low-voltage FET) is connected between the gate 110 and the source 102 of the switch 107 Further, in some examples, the system 701 comprises gate driver circuitry including protection devices 700, 702 to protect downstream components from overvoltage conditions and buffers 704, 706. The buffers 704, 706 may be powered by the power rails 122, 124. FIG. 7 also depicts a controller 703, which may or may not be considered part of the system 701.

When the controller 703, which is responsible for controlling the operation of the bi-directional GaN device 705, determines that the bi-directional GaN device 705 should be de-activated, the controller 703 first determines which of the source terminals 102, 104 has the lower potential (i.e., Vmin). For instance, the controller 703 may include a comparator that receives connections to the source terminals 102, 104 as inputs (such as the examples depicted in FIGS. 2 and 3). In response to this determination, the controller 703 turns off a corresponding switch 106, 107. For example, in response to the controller 703 determining that the source terminal 104 has a lower potential than the source terminal 102, the controller 703 may turn off the switch 106. Similarly, in response to the controller 703 determining that the source terminal 102 has a lower potential than the source terminal 104, the controller 703 may turn off the switch 107. To turn off the switch 106, 107, the controller 703 issues a control signal to a corresponding buffer 704, 706. The outputs of the buffers control the switches 400, 402 such that when a switch 106, 107 is to be deactivated, the corresponding switch 400, 402 is closed, thus causing the gate-to-source voltage of the corresponding switch 106, 107 to go to zero or approximately zero. For example, if the switch 107 is to be turned off, the controller 703 may close the switch 402, thus causing the gate terminal 110 and source terminal 102 to be connected and preventing the gate-to-source voltage of the switch 107 from reaching the threshold voltage for the switch 107. In this way, the switch 107 is turned off. The switch 106, 107 corresponding to the source terminal 104, 102 with the higher potential (i.e., not Vmin) remains floating, i.e., both the charging path switches 504, 506 and the discharging path switches 400, 402 are disabled.

Figure 8:
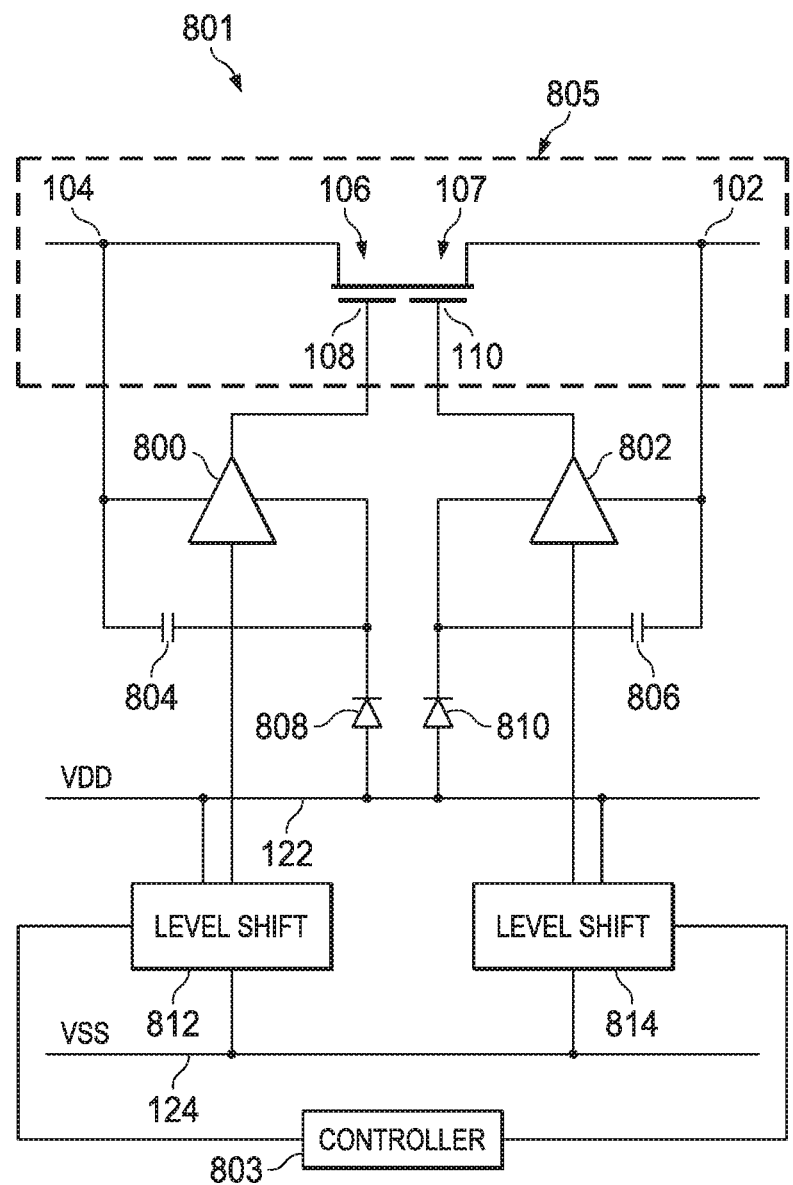
FIG. 8 is a schematic diagram depicting aspects of a gate driver in an illustrative bi-directional switching device in accordance with various examples.

FIG. 8 is a schematic diagram depicting aspects of a gate driver in an illustrative bi-directional GaN device 805 in a system 801 in accordance with various examples. In some examples, the bi-directional GaN device 805 includes the switches 106, 107, the source terminals 102, 104, and the gate terminals 108, 110. In addition, in some examples, the system 801 includes power rails 122, 124, buffers 800, 802, bootstrap capacitors 804, 806, diodes 808, 810, and level shifters 812, 814. The bootstrap capacitor 804 couples to the source terminal 104 and supplies power to the buffer 800. Similarly, the bootstrap capacitor 806 couples to the source terminal 102 and supplies power to the buffer 802. FIG. 8 also depicts a controller 803, which may or may not be considered part of the system 801.

In this example, the gate terminals 108, 110 of the switches 106, 107 are directly controlled by the buffers 800, 802 (both charging and discharging paths). The buffers 800, 802 are supplied by the two bootstrap capacitors 804, 806, providing a floating supply with respect to the respective source terminals 102, 104. The gate control signals are provided to these floating supply domains by high-voltage level shifters 812, 814, which, in turn, are controlled by the controller 803. The bootstrap capacitors 804, 806 are charged to the floating, isolated power supply determined by the power rails 122 and 124 and are frequently refreshed. For example, when the source terminal 104 has a lower potential than the source terminal 102, the diode 808 provides a current path to charge the bootstrap capacitor 804. Similarly, when the source terminal 102 has a lower potential than the source terminal 104, the diode 810 provides a current path to charge the bootstrap capacitor 806. In case the bidirectional device 805 is turned on (i.e., both switches 106, 107 are closed), the voltage potential of the two source terminals 104, 102 is equal or similar and both bootstrap capacitors 804, 806 are recharged simultaneously.

As explained above, the various examples depicted in FIGS. 1-8 may be combined as desired and as may be appropriate. For instance, the buffers 500, 502 of FIG. 5 may be included in the example of FIG. 7 to control switches 504, 506. Similarly, each of the examples depicted in the drawings may include switchable connections between the power rail 124 and the source terminals 102, 104, as described with respect to FIGS. 2-3. Likewise, for example, the gate driver circuitry of FIG. 6 may be combined with the gate driver circuitry of FIG. 7 to provide both activation and deactivation capabilities for the bi-directional GaN device. In some examples, some or all of the circuitry of FIGS. 5-8 is combined. In some examples, the circuitry of FIG. 2 is combined with the circuitry of any or all of FIGS. 5-8. In some examples, the circuitry of FIG. 3 is combined with the circuitry of any or all of FIGS. 5-8. Each of the figures omits at least some components of the bi-directional GaN device for ease of explanation; however, any and all combinations of the various examples disclosed herein are contemplated and fall within the scope of this disclosure.

The above discussion is meant to be illustrative of the principles and various example implementations of bi-directional switch control according to the present disclosure. Numerous variations and modifications will become apparent to those skilled in the art once the above disclosure is fully appreciated. It is intended that the following claims be interpreted to embrace all such variations and modifications.

What is claimed is:

1. A system comprising:
a bi-directional device including first and second switches and a substrate, the first switch including a first gate and a first source, the second switch including a second gate and a second source, and the substrate shared between the first and second switches;
a third switch coupled between the first source and the substrate;
a fourth switch coupled between the second source and the substrate; and
a comparator having first and second inputs coupled to the first and second sources, respectively, and first and second outputs coupled to the control terminals of the third and fourth switches, respectively.

2. The system of claim 1, wherein the comparator and the third and fourth switches are configured to couple the substrate to the source among the first and second sources that has the lower voltage potential.

3. The system of claim 2, further comprising a gate driver having first and second outputs coupled to control terminals of the first and second switches, respectively, and configured to control operation of the bi-directional device.

4. The system of claim 3, wherein the gate driver is supplied by a floating power supply.

5. The system of claim 4, wherein the floating power supply is referenced to a voltage potential of the substrate.

6. The system of claim 4, wherein the control terminals of the first and second switches are coupled to a positive power rail of the floating power supply using fifth and sixth switches, respectively.

7. The system of claim 1, further comprising:
a first overvoltage protection device coupled between the first source and the first comparator input; and
a second overvoltage protection device coupled between the second source and the second comparator input.

8. A system comprising:
a bi-directional device having first and second sources, first and second control terminals, and a substrate;
a first switch positioned between the first control terminal and a power rail;
a second switch positioned between the second control terminal and the power rail;

a third switch having a third source coupled to the first source, a third control terminal coupled to the first control terminal, and a third drain;

a fourth switch having a fourth source coupled to the second source, a fourth control terminal coupled to the second control terminal, and a fourth drain coupled to the third drain; and a comparator having a first input coupled to the third and fourth drains and a second input to receive a threshold signal, an output of the comparator configured to control activation of the bi-directional device.

9. The system of claim 8, further comprising an overvoltage protection device coupled between the first input to the comparator and the third and fourth drains.

10. The system of claim 8, further comprising circuitry to couple the substrate to the first source in response to the first source having a lower voltage than the second source.

11. The system of claim 8, further comprising circuitry to disconnect the substrate from the first source in response to the first source having a higher voltage than the second source and to disconnect the substrate from the second source in response to the second source having a higher voltage than the first source.

12. The system of claim 11, wherein the comparator provides two outputs with one output being the inversion of the other output.

13. The system of claim 11, wherein the circuitry comprises a first connection between the second source and a seventh switch positioned between the first source and the substrate and a second connection between the first source and an eighth switch positioned between the second source and the substrate.

14. The system of claim 8 further comprising a controller to activate the third switch and activate the fourth switch in response to the output of the comparator.

15. The system of claim 8 further comprising a controller to close at least one of the fifth and sixth switches to deactivate the bidirectional device.

16. The system of claim 15, wherein the output of the comparator is coupled to the input of the controller.

17. A system comprising:

a bi-directional device comprising first and second control terminals, first and second sources, and a substrate;

a first buffer element having an output coupled to the first control terminal and an input coupled to the output of a first level shifter;

a second buffer element having an output coupled to the second control terminal and an input coupled to the output of a second level shifter;

a first capacitor coupled between the first source and a supply terminal of the first buffer element;

a second capacitor coupled between the second source and a supply terminal of the second buffer element;

a first diode having a cathode coupled to the first capacitor; and a second diode having a cathode coupled to the second capacitor circuit logic configured to couple the substrate to the first source in response to the first source having a voltage greater than that of the second source.

18. The system of claim 17, wherein the circuit logic comprises a first connection between the first source and a first switch positioned between the second source and the substrate, and a second connection between the second source and a second switch positioned between the first source and the substrate.

19. The system of claim 17 further comprising a controller having a first output coupled to a controller input of the first level shifter and a second output coupled to a controller input of the second level shifter.

* * * * *